United States Patent
Sunaga et al.

(10) Patent No.: US 6,737,770 B2
(45) Date of Patent: May 18, 2004

(54) BRUSHLESS MOTOR

(75) Inventors: Hideki Sunaga, Gunma (JP); Takeshi Ohba, Tochigi (JP); Hiromi Kawarai, Tochigi (JP); Kazunori Yamada, Tochigi (JP); Narihito Sano, Tochigi (JP)

(73) Assignee: Calsonic Kansei Corporation, Tokyo (JP)

( * ) Notice: Subject to any disclaimer, the term of this patent is extended or adjusted under 35 U.S.C. 154(b) by 67 days.

(21) Appl. No.: 10/042,305

(22) Filed: Jan. 11, 2002

(65) Prior Publication Data

US 2002/0093259 A1 Jul. 18, 2002

(30) Foreign Application Priority Data

Jan. 16, 2001 (JP) ........................................ 2001-008195
Aug. 9, 2001 (JP) ........................................ 2001-242627

(51) Int. Cl.⁷ .............................................. H01H 37/76
(52) U.S. Cl. .................................. 310/68 C; 310/68 R
(58) Field of Search ............................. 310/68 R, 68 C, 310/DIG. 6; 318/254, 138; 337/262

(56) References Cited

U.S. PATENT DOCUMENTS 5,606,232 A * 2/1997 Harlan et al. ............... 318/138
6,198,184 B1 * 3/2001 Ohi et al. ................. 310/68 C

FOREIGN PATENT DOCUMENTS

JP      11-283478      10/1999      .......... H01H/37/76

* cited by examiner

Primary Examiner—Burton S. Mullins
Assistant Examiner—Nguyen N Hanh
(74) Attorney, Agent, or Firm—Foley & Lardner LLP

(57) ABSTRACT

A brushless motor for a blower fan unit has a circuit structure constituted by a drive control circuit and a fuse member. The drive control circuit supplying drive current comprises a first circuit section for eliminating surges of electric power and a second circuit section for controlling magnetic field generated by the stator. The first and second circuit sections are three-dimensionally arranged with a predetermined space therebetween. The fuse member electrically connects the first and second circuit sections. An end portion of the fuse member is welded with the first circuit section, and the other end portion of the fuse member is soldered with the second circuit section. The fuse member cuts an electrical connection between the first and second circuit sections when a temperature of solder becomes higher than a predetermined temperature.

13 Claims, 10 Drawing Sheets

BRUSHLESS MOTOR

BACKGROUND OF THE INVENTION

The present invention relates to a brushless motor such as a motor for a blower unit of an air conditioning system of automotive vehicles.

Japanese Patent Provisional Publication No. 11-283478 discloses a brushless motor employed as a motor for a blower fan of an automotive air conditioner unit. Particularly, this brushless motor is arranged such that a fuse member is installed on a printed wiring board including a motor drive circuit in order to properly shut off the electric conduction. The fuse member employed in this brushless motor is constituted by a clipping end portion, an elastic intermediate portion and a soldered end portion. The fuse member is arranged such that the clipping end portion clips a first terminal portion of the printed wiring board, and the soldered end portion is soldered with a second terminal portion while the elastic intermediate portion is elastically deformed. Further, the clipping end portion is soldered with the first terminal by another solder whose melting point is higher than that of the solder for the soldered end portion.

SUMMARY OF THE INVENTION

However, such a brushless motor has been required to solve problems resulted from the arrangement of the fuse member.

It is therefore an object of the present invention to provide an improved brushless motor which performs high productivity and high reliability.

An aspect of the present invention resides in a brushless motor which comprises a stator, a rotor, a first circuit section, a second circuit section and a fuse member. The stator comprises a plurality of exciting coils which receives drive current. The rotor is rotatable relative to the stator. The first circuit section comprises a filter circuit for eliminating surges of electric power for the drive current. The first circuit section is produced on a wiring metal piece. The second circuit section comprises a control circuit for controlling magnetic field generated by the stator by controlling the drive current. The second circuit section is produced on a printed wiring board. The fuse member electrically connects the wiring metal piece of the first circuit section and a wiring pattern formed on the printed wiring board of the second circuit section. The fuse member electrically disconnects the wiring metal piece and the wiring pattern when a temperature of the wiring pattern becomes higher than a predetermined temperature.

Another aspect of the present invention resides in a brushless motor which comprises a stator, a rotor, a drive control circuit and a fuse member. The stator comprises a plurality of exciting coils of exciting coils which receives drive current. The rotor is rotatable relative to the stator. The drive control circuit supplying the drive current to the exciting coils. The drive control circuit comprises a first circuit section for eliminating surges of electric power and a second circuit section for controlling magnetic field generated by the stator by controlling drive current treated in the first circuit section. The first circuit section and the second circuit section are arranged generally in parallel with a predetermined space therebetween. The fuse member electrically connecting the first circuit section and the second circuit section. An end portion of the fuse member is welded with the first circuit section. The other end portion of the fuse member is soldered with second circuit section. The fuse member cuts an electrical connection between the first circuit section and the second circuit section when a temperature of a part of the second circuit section becomes higher than a predetermined temperature.

Another aspect of the present invention resides in a circuit structure of a brushless motor. The circuit structure comprises a drive control circuit and a fuse member. The drive control circuit supplies drive current to exciting coils of a stator of the brusless motor. The drive control circuit comprises a first circuit section for eliminating surges of electric power and a second circuit section for controlling magnetic field generated by the stator by controlling drive current passed through the first circuit section in order to control a rotation of a rotor of the brushless motor. The first and second circuit sections are three-dimensionally arranged with a predetermined space therebetween. The fuse member comprises a first end portion welded with the first circuit section, a second end portion soldered with the second circuit section and an intermediate elastic portion which is elastically deformed when the second end portion is soldered with the second circuit section. The second end portion is released from the second circuit section when solder connecting the second end portion and the second circuit section is melted.

The other objects and features of this invention will become understood from the following description with reference to the accompanying drawings.

DETAILED DESCRIPTION OF THE INVENTION

Referring to FIGS. 1 to 11, there is shown an embodiment of a brushless motor 1 which is employed in a blower unit of an air-conditioner unit for a vehicle.

Figure 1:
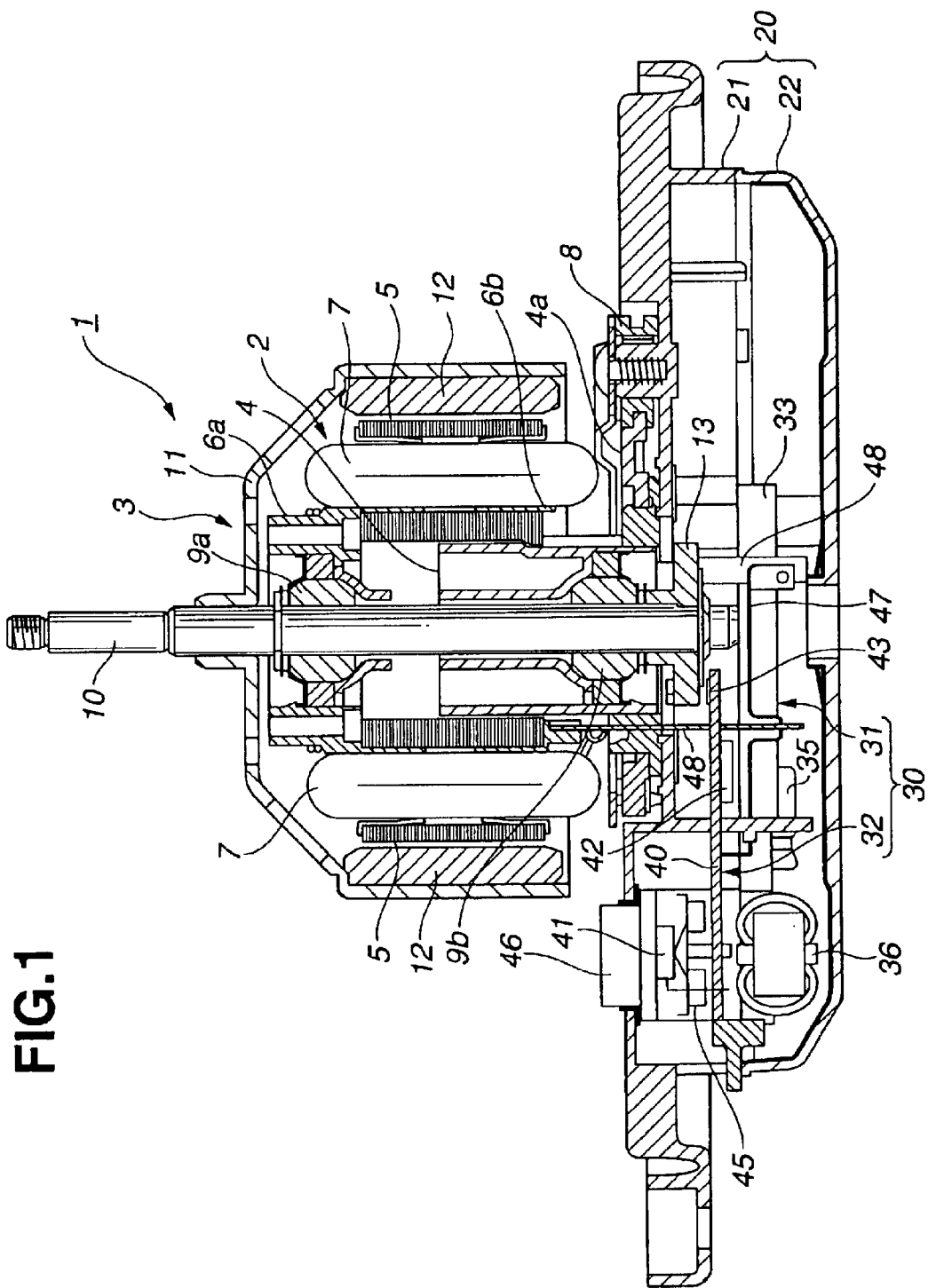
FIG. 1 is a cross sectional view showing a brushless motor of an embodiment according to the present invention.

As shown in FIG. 1, the brushless motor 1 is of a three-phase two-pole wire-wound type and comprises a stator 2 fixed to a circuit protection case 20 and a rotor 3 rotatably supported by the stator 2.

The stator 2 comprises a housing 4 installed on the circuit protection case 20, a core 5 fixed at an outer peripheral side of the housing 4, a pair of electric insulators 6a and 6b which are assembled with the core 5, and three exciting coils 7 which are wound around the core 5 through the electric insulators 6a and 6b.

The housing 4 is made of aluminum alloy and is formed into a column shape. A flange portion 4a projects outwardly from a lower end portion of the housing 4. The flange portion 4a is fixed to the circuit protection case 20 made of resin through a vibration proof rubber 8 by means of screws.

The core 5 is made by laminating a plurality of metal plates and is fixed on an outer peripheral portion of the housing 4. The three exciting coils 7 are wound around the core 5 through the pair of electric insulators 6a and 6b. The exciting coils 7 generate a magnetic field at the stator 2 when the exciting coils 7 receive drive current from a drive control circuit 30 provided in the circuit protection case 20.

The rotor 3 comprises a motor shaft 10 which is rotatably supported by the housing 4 through a pair of bearings 9a and 9b, a yoke 11 which is fixed at a portion near a first end portion of the motor shaft 10 and four permanent magnets 12 which are attached on an inner periphery of the yoke 11.

A blower fan (not shown) of a blower unit for the air-conditioner unit is capable of being installed at a first end portion of the motor shaft 10. A main part of the motor shaft 10 is inserted into the circuit protection case 20, and a sensor magnet 13 for detecting a rotational position of the rotor 3 is installed at a second end portion of the motor shaft 10. The sensor magnet 13 has four magnetized portions corresponding to the four permanent magnets 12. Each of the magnetized portions of the sensor magnet 13 has a polarity as same as that of the corresponding permanent magnet 12.

The yoke 11 is made of metal and is formed into a bowl shape. An end portion of the yoke 11, which portion corresponds to a bottom center portion of a bowl as shown in FIG. 1, is fixed to the motor shaft 10 so as to cover an outer periphery of the core 5. The four permanent magnets 12 are attached on the inner periphery of the yoke 11 so as to generate a rotational force to the rotor 3 due to the interaction between the magnetic field by the stator 2 and the magnetic field by the permanent magnets 12. The permanent magnets 12 are disposed opposite to the core 5 with a small clearance, and are arranged at predetermined equal intervals so as to alternatively (adjacently) locate a positive polarity magnet and a negative polarity magnet.

Figure 2:
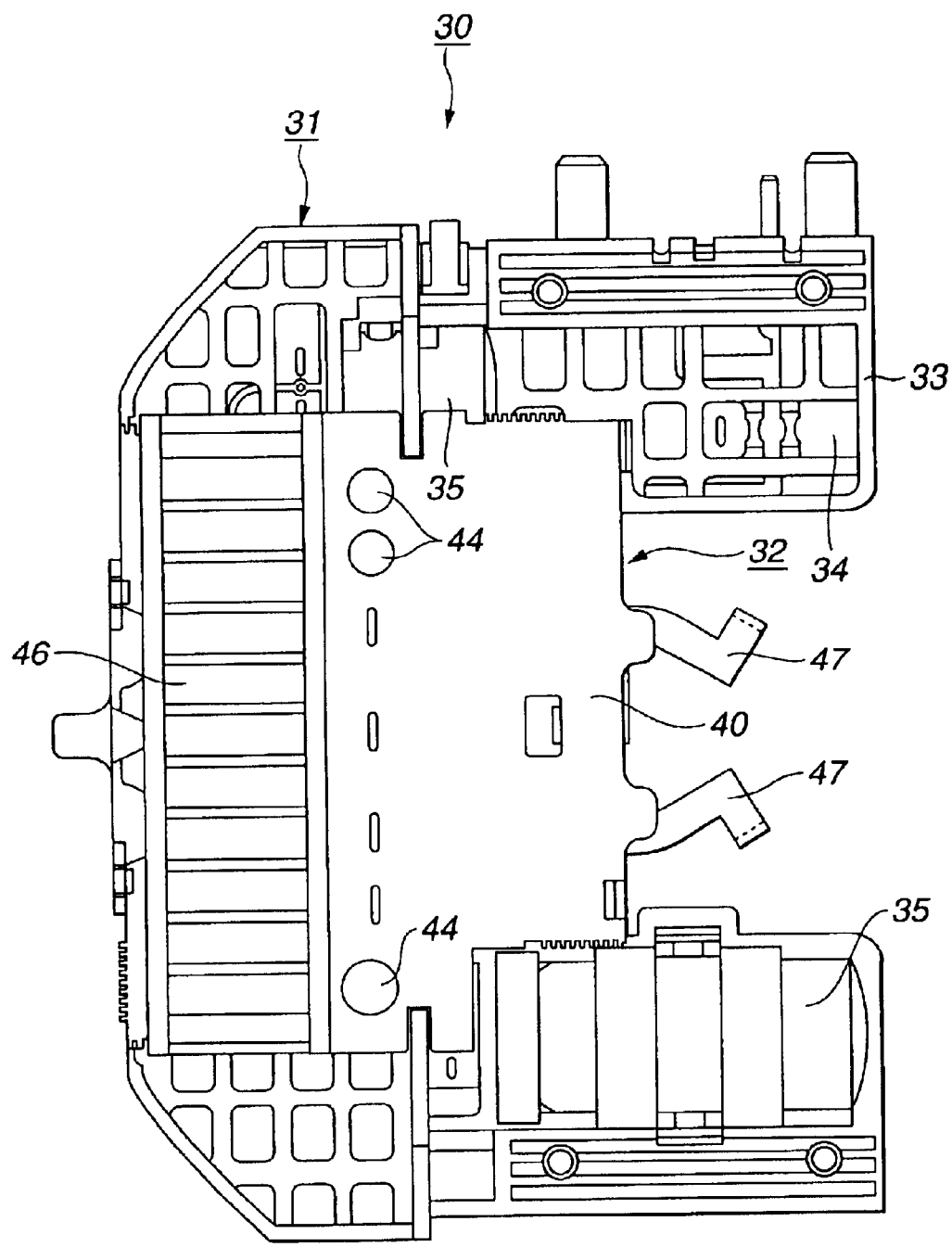
FIG. 2 is a plan view showing an upper side of a drive control circuit in the brushless motor of FIG. 1.
Figure 3:
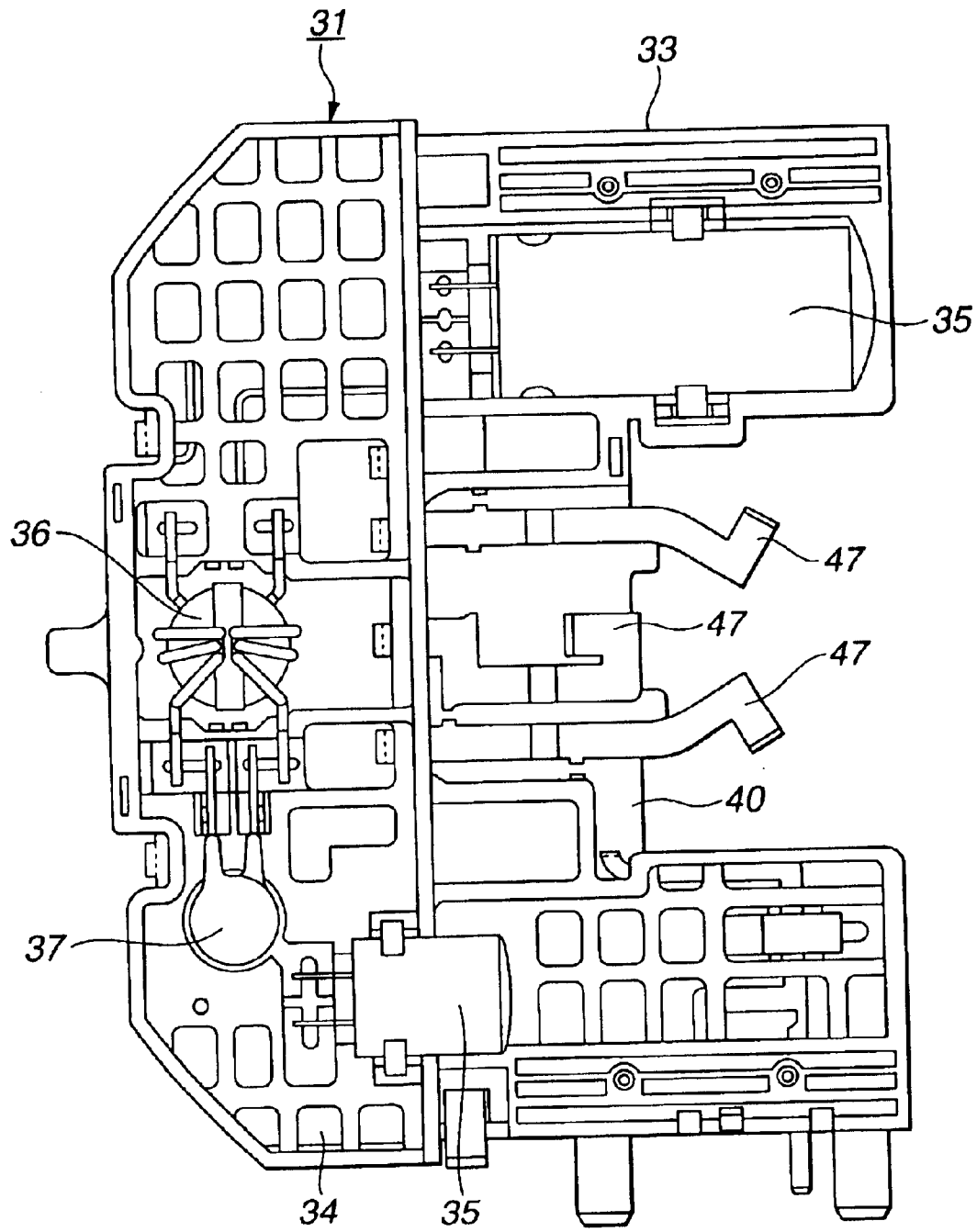
FIG. 3 is a plan view showing a lower side of the drive control circuit.
Figure 4:
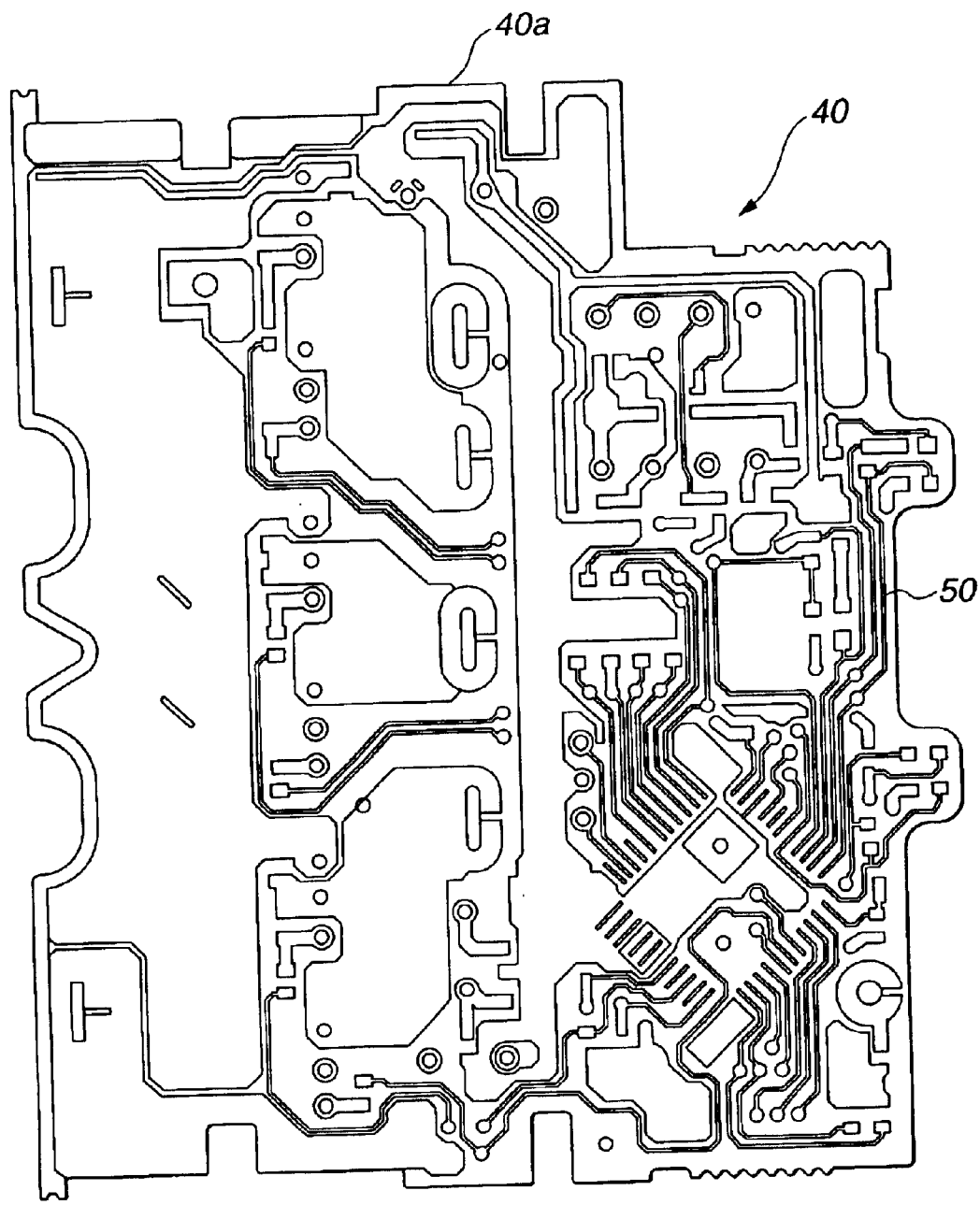
FIG. 4 is a plan view showing a printed wiring board on which a filter circuit of the brushless motor is produced.

The circuit protection case 20 comprises a pair of an upper case 21 and a lower case 22. A drive control circuit 30, which supplies the drive current to the exciting coils 7 of the stator 2, is received in the circuit protection case 20. The drive control circuit 30 comprises a first circuit section 31 for eliminating surges of the supply electric power and a second circuit section 32 for controlling the rotation of the rotor 3 by timely switching the direction of drive current supplied to the exciting coils 7 through the first circuit section 31. The first circuit section 31 of the drive control circuit 30 is provided in a resinous inner case 33 (functioning as an insulator) fixed in the circuit protection case 20, as shown in FIGS. 1 to 3. FIG. 2 is a plan view showing a top surface of the drive control circuit 30. FIG. 3 is a plan view showing a bottom view of the drive control circuit 30.

A plurality of wiring metal pieces 34 are produced by punching a sheet metal and are assembled into the inner case 33 by means of insert molding so as to form a wiring pattern. Further, various electric parts such as an electrolytic capacitor 35, a common mode choke coil 36 and a varistor (variable-resistor) 37 are installed on the inner case 33 and connected to the wiring pattern. A filter circuit is constructed by the wiring metal pieces 34 and the electric parts installed in the inner case 33. The inner case 33 having the filter circuit is fixed at an installation portion perpendicularly projecting from a top wall of the upper case 21 by means of screw so as to be located at a predetermined position in the circuit protection case 20.

On the other hand, the second circuit section 32 of the drive control circuit 30 is for controlling the rotation of the rotor 3 and is provided on a printed wiring board 40 which is fixed inside the circuit protection case 20 so as to be located above the inner case 33. The printed wiring board 40 comprises a predetermined wiring pattern 50 which is made by patterning. Further, installed on the printed wiring board 40 are electric parts, such as switching devices 41 for changing the direction of the drive current supplied to the exciting coils 7 of the stator 2 through the first circuit section 31, a control IC 42 for controlling switching timing of the respective switching devices 41, Hall effect devices 43 for detecting the rotational position of the rotor 3 in conjunction with the sensor magnet 13, and an electrolytic capacitor 44. The electric parts and a wiring pattern provided on the printed wiring board 40 construct a control circuit.

Since the switching devices 41 generate lots of heat, the switching devices 41 are fittingly contacted with a heat sink 46 by means of spring members 45. Heat generated by the switching devices 41 and other electric parts is radiated outside of the circuit protection case 20 through the heat sink 46.

The printed wiring board 40 with the control circuit of the second circuit section 32 is disposed above the inner case 33 and is fixed on the upper case 21 through the inner case 33. The filter circuit of the first circuit section 31 and the control circuit of the second circuit section 32 are electrically connected with each other by means of a fuse member 60 provided between a predetermined portion of the wiring metal piece 34 and a predetermined position of the printed wiring board 40. More specifically, the first circuit section 31 and the second circuit section 32 are generally arranged in parallel and construct the drive control circuit 30. The first circuit section 31 and the second circuit section 32 are electrically connected through the fuse member 60 and are disposed to produce a space therebetween in the circuit protection case 20. That is, the first and second circuit sections 31 and 32 are arranged three-dimensionally.

The control circuit of the second circuit section 32 is electrically connected with the exciting coils 7 of the stator 2 through terminal pins 48. The terminal pins 48 penetrate bus bars 47 and the upper case 21 which are assembled with the wiring metal pieces 34 in the inner case 33. With this arrangement, the stator 2 generates the magnetic field according to the drive current from the drive control circuit 30, and therefore the rotation of the rotor 3 is controlled by the drive control circuit 30.

The brushless motor 1 according to the present invention is arranged such that the drive control circuit 30 is divided into the first circuit section 31 including the first circuit and the second circuit section 32 including the control circuit and that the first and second circuit sections 31 and 32 are arranged three-dimensionally in the circuit protection case 20. Accordingly, the drive control circuit 30 is produced compactly, and the brushless motor 1 is also produced compactly. Further, since the filter circuit and the control circuit are dividedly arranged in space, it becomes possible to effectively suppress the interference of heat and electromagnetic wave between the filter circuit and the control circuit.

Figure 5:
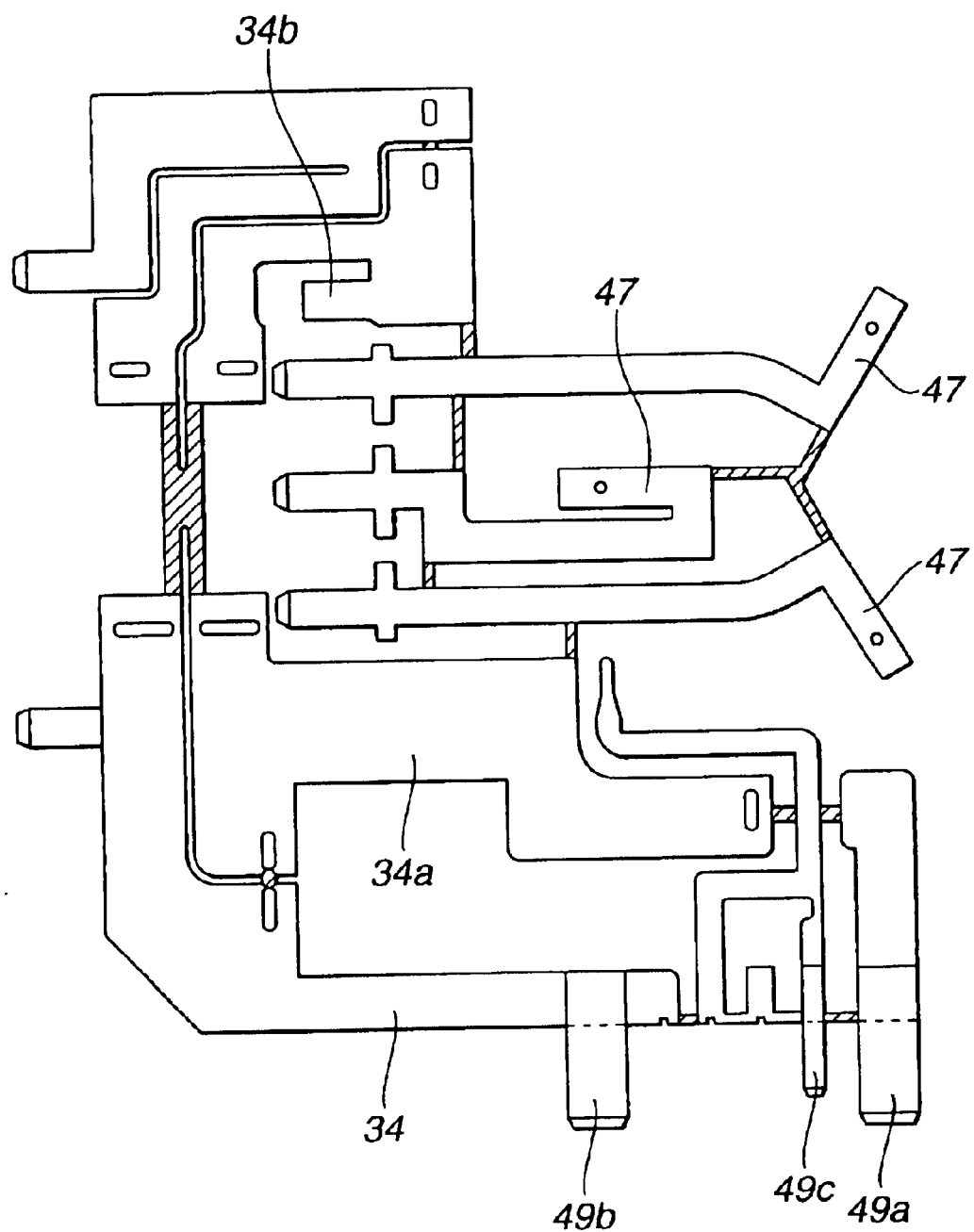
FIG. 5 is a plan view showing wiring metal pieces and wiring bus bars which are not yet assembled into an inner case.

The wiring metal pieces 34 of the first circuit section 31 are integrally produced by punching a sheet metal and are assembled into the inner case 33, as shown in FIG. 5. Then, the wiring metal pieces 34 are separated respectively by cutting away portions shown by hatching lines of FIG. 5. Further, the connecting bus bars 47, which are also assembled with the inner case 33 together with the wiring metal pieces 34, are also integrally produced by the punching process and are assembled with the inner case 33. Thereafter, the connecting bus bars 47 are separated from the wiring metal pieces 34 by cutting away the portions shown by hatching lines of FIG. 5. FIG. 5 is a plan view showing the wiring metal pieces 34 and the connecting bus bars 47 which are not yet separated.

The wiring metal pieces 34 comprise connector terminals which are electrically connected to connectors. The connector terminals comprise a plus terminal 49a for receiving electric power from electric power source, an earth (grounded) terminal 49b for being electrically connected to a vehicle body and a signal terminal 49c for receiving an external control signal. The plus terminal 49a, the earth (grounded) terminal 49b and the signal terminal 49c are fixedly welded with end portions of the wiring metal pieces 34 so that end portions of these terminals 49a, 49b and 49c project from a side surface of the inner case when the wiring metal pieces 34 are assembled in the inner case 33.

Figure 6:
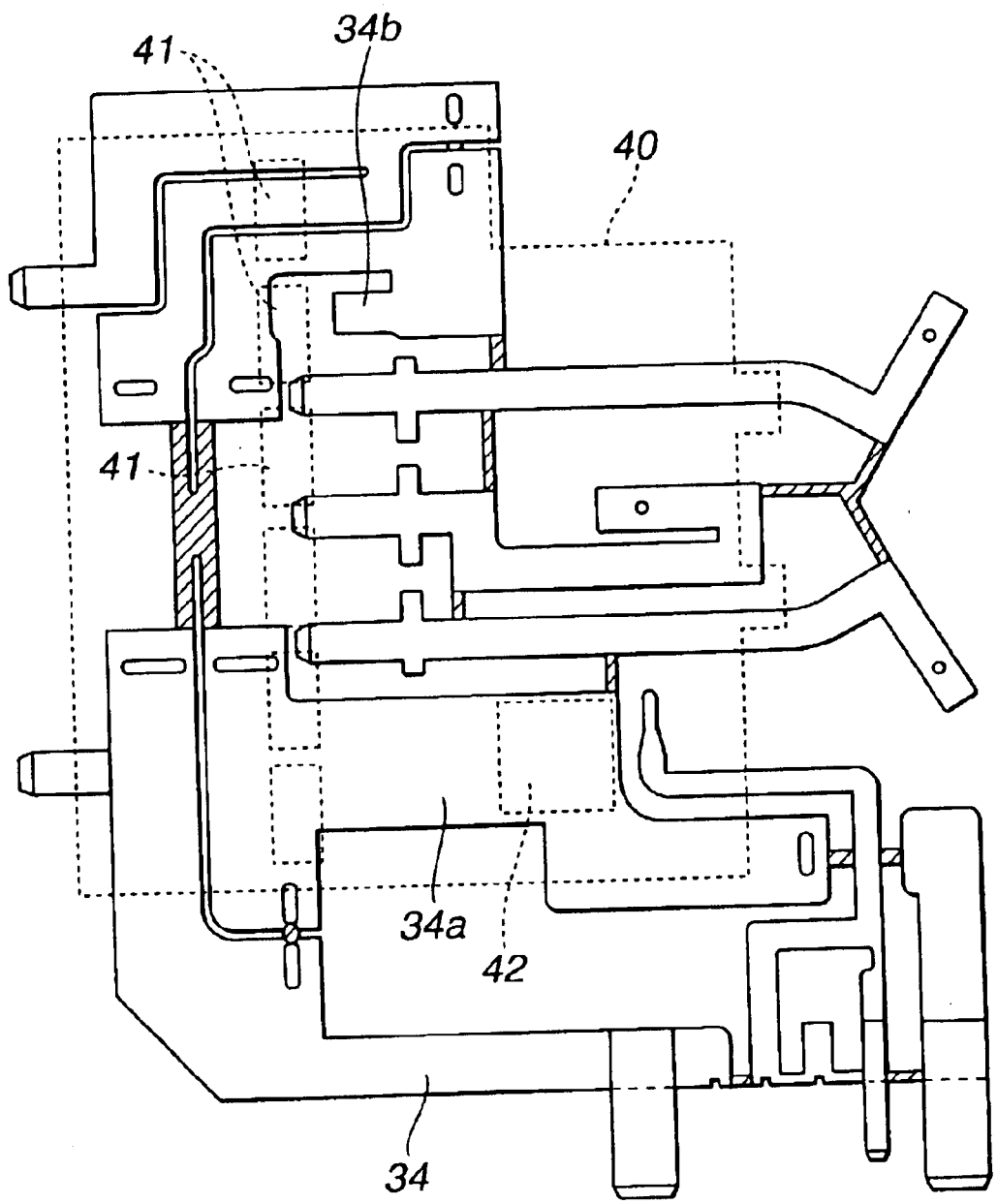
FIG. 6 is a plan view showing a positional relationship between the wiring metal pieces and the printed wiring board.

Further, when the wiring metal pieces 34 are assembled in the inner case 33 and are installed in the circuit protection case 20 as shown in FIG. 6, a part of the wiring metal pieces 34, which is located just under the control IC 42 installed in the printed wiring board 40, is widely formed. The widely formed portion covers the control IC 42 and functions as a shielding portion 34a for preventing disturbance noises from being applied to the control IC 42.

Since the brushless motor 1 according to the present invention is arranged to prevent the disturbance noise from affecting the control IC 42 by providing the shielding portion 34a at an overlapping portion between the wiring metal pieces 34 34 and the control IC 42, it is becomes possible to effectively suppress wrong operations of the control IC 42 and to properly operate the control IC 42. Further, since the brushless motor 2 according to the present invention is arranged such that a part of the wiring metal pieces 34 has a function of shielding the control IC 42, it is not necessary to newly prepare a member for shielding the control IC 42. This arrangement decreases the number of parts of the brushless motor 1 according to the present invention and the production cost of the brushless motor 1.

Figure 7A:
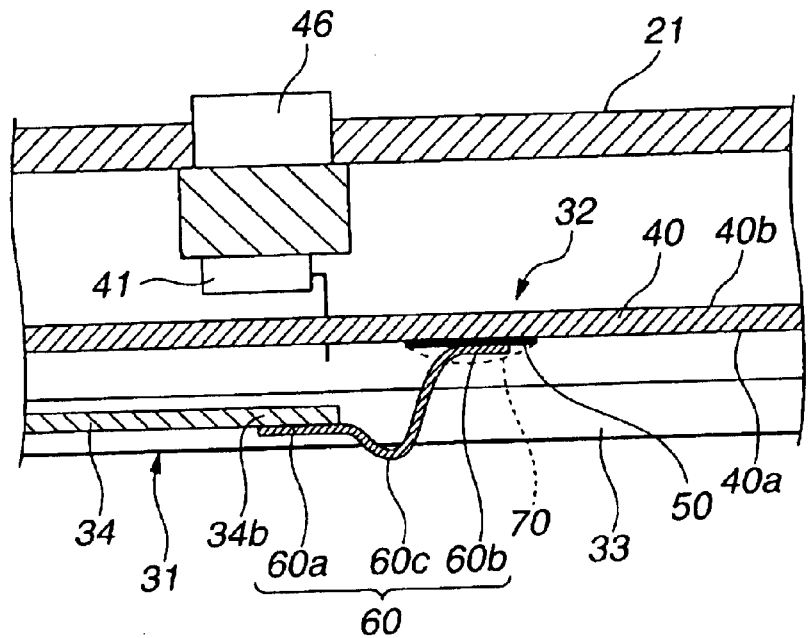
FIG. 7A is a partial cross sectional view showing that an end portion of the fuse member is soldered on a terminal portion of a wiring pattern.
Figure 7B:
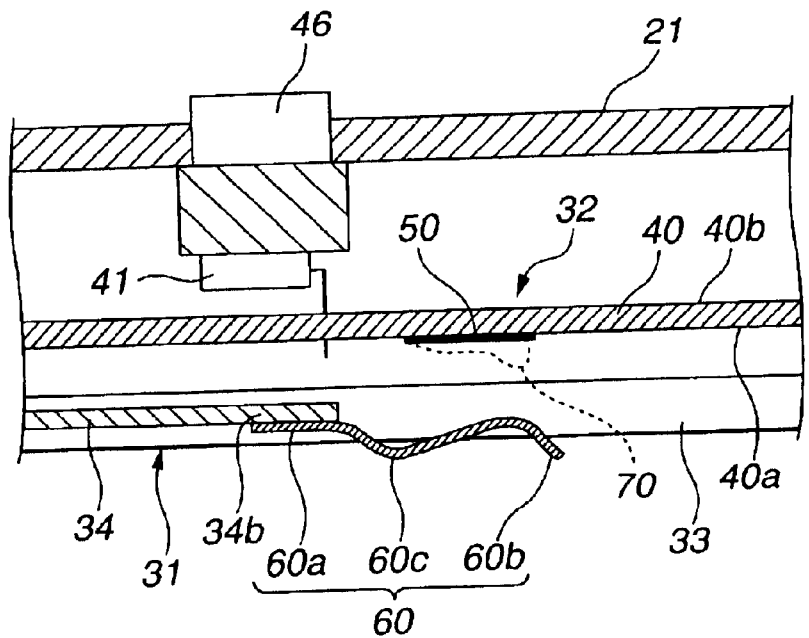
FIG. 7B is a partial cross sectional view showing that the end portion of the fuse member is released from the terminal portion of the wiring pattern due to melting of solder.

As shown in FIG. 6, the wiring metal pieces 34 comprise a fuse fixing portion 34b which is fixed with an end portion of the fuse member 60. The fuse fixing portion 34b is located at a position near a part of the switching device 41 installed on the printed wiring board 40 when the wiring metal pieces 34 are assembled in the inner case 33 and installed in the circuit protecting case 20. The fuse member 60 is made of an elastic electro-conductive material such as phosphor bronze and is bent into a predetermined shape. As schematically shown in FIGS. 7A and 7B, the fuse member 60 is disposed on a back surface 40a relative to a front surface 40b of the printed wiring board 40 on which the switching devices 41 are installed, and connects the wiring metal pieces 34 of the first circuit section 31 and the wiring pattern 50 of the second circuit section 32.

More specifically, an end portion 60a of the fuse member 60 is fixed on the fuse fixing portion 34b provided near the switching devices 41 by means of welding. Further, the other end portion 60b of the fuse member 60 is fixed to a terminal portion of the wiring pattern 50 on the printed wiring board 40 by means of soldering. The soldering employs solder 70 which melts at a predetermined temperature. Since an intermediate portion of the fuse portion 60 is set at an elastically deformed state under the soldered condition, the other end portion 60b of the fuse member 60 is soldered to a terminal portion of the wiring pattern 50 against the elastic returning force of the fuse member 60.

Since the brushless motor 1 is arranged such that the end portion 60a of the fuse member 60 is fixed to the fuse fixing portion 34b of the wiring metal pieces 34 and the other end portion 60b of the fuse member 60 is soldered with the terminal portion of the wiring pattern 50 by means of solder 70, the filter circuit of the first circuit section 31 is electrically connected with the control circuit of the second circuit section 32 through the fuse member 60. That is, the brushless motor 1 is arranged such that the fuse member 60 functions to electrically connect the filter circuit of the first circuit section 31 and the control circuit of the second circuit section 32, which are three-dimensionally arranged, and to operate the drive control circuit 30.

Therefore, the drive control circuit 30 provided with the fuse member 60 is arranged such that the solder 70 provided on the terminal portion of the wiring pattern 50 is melted when over-current is applied to the wiring pattern 50 of the printed wiring board 40 or when the temperature of the terminal portion of the wiring pattern 50 becomes higher than a predetermined temperature by an abnormal increase of the ambient temperature around the fuse member 60.

Specifically, since the fuse member 60 is disposed in the vicinity of the switching devices 41 which generate a large quantity of heat, if the temperature of the printed wiring board 40 is abnormally raised by the abnormal heating of the switching devices 41, the solder 70 on the terminal portion of the wiring pattern 50 is melted by the heat. When the solder 70 on the terminal portion of the wiring pattern 50 is melted as shown in FIG. 7B, the other end portion 60b of the fuse member 60 is separated from the terminal portion of the wiring pattern 50 due to the elastic returning force of the fuse member 60 so that the electrical connection between the fuse fixing portion 34b of the wiring metal pieces 34 and the terminal portion of the wiring pattern 50 is cut. That is, the electrical connection between the filter circuit of the first circuit section 31 and the control circuit of the second circuit section 32 is cut.

That is, the brushless motor 1 according to the present invention is arranged such that the filter circuit of the first circuit section 31 and the control circuit of the second circuit section 32 are electrically disconnected by the function of the fuse member 60 to stop the operation of the drive control circuit 30 when the temperature of the terminal portion of the wiring pattern 60 becomes higher than the predetermined temperature by the over current at the wiring pattern 50 of the printed wiring board 40 or by the abnormal increase of the temperature of the printed wiring board 40. Therefore, it is possible to prevent the parts of the drive control circuit 30 from being broken by the over current.

More particularly, since the fuse member 60 is disposed on the back surface 40*a* of the printed wiring board 40 on which the switching devices 41 are installed, it is possible to locate the fuse member 60 in the vicinity of the switch devices 41 without interfering the switching devices 41 and the heat sink 46. Further, the fuse member 60 properly protects the drive control circuit 30 by properly detecting the abnormal heat of the switching devices 41.

Since the end portion 60*a* of the fuse member 60 is fixed on the wiring metal pieces 34 by welding, even if the heat of the printed wiring board 40 and the circumferential temperature is transmitted to the fuse member 60, the heat is effectively radiated by the wiring metal pieces 34.

For example, if a fuse member is disposed on a printed wiring board and if both end portions of the fuse member are connected to different terminal portions of the wiring pattern, it is difficult to effectively radiate the heat of the fuse member to the printed wiring board through copper film.

In contrast to this, the fuse member 60 employed in the brushless motor 1 according to the present invention is arranged such that the end portion 60*a* of the fuse member 60 is fixed to the wiring metal pieces 34 which perform a high heat radiating performance as compared with that of the wiring pattern 50. Accordingly, the fuse member 60 effectively radiates the heat to the wiring metal pieces 34 and maintains a spring characteristic which tends to be degraded by heat. That is, the brushless motor 1 according to the present invention is arranged such that when the drive control circuit 30 receives over current and/or increases its own temperature, the fuse member 60 properly functions and certainly stops the operation of the drive control circuit 30 to protect the electric parts of the drive control circuit 30 from being broken by the over current or the heat. Further, since the end portion 60*a* of the fuse member 60 is fixed on the wiring metal piece 34 by welding, the end portion 60*a* of the fuse member 60 is never detached from the wiring metal piece 34 even if the fuse member 60 is heated by the abnormal increase of the temperature of the wiring pattern 50 or of the ambient temperature.

For example, if a fuse member is disposed on the printed wiring board and if both end portions of the fuse member are connected to different terminal portions of the wiring pattern, the both end portions of the fuse member will be detached from the terminal portions when the fuse member is heated. Such a both-ends detached condition of the fuse member unstably moves the fuse member from a predetermined connecting position and will contact with other portions of the wiring pattern and other electric parts. This contact of the fuse member with other portions and parts will establish a short circuit.

In contrast to this, the fuse member 60 of the brushless motor 1 according to the present invention is arranged such that the end portion 60*a* of the fuse member 60 is fixed on the wiring metal piece 34 by welding. Accordingly, even if the fuse member 60 is heated, the end portion 60*a* of the fuse member 60 is fixedly connected with the wiring metal piece 34 without unstably changing its position. This stable positioning of the fuse member 60 solves the above-discussed problem.

Figure 8A:
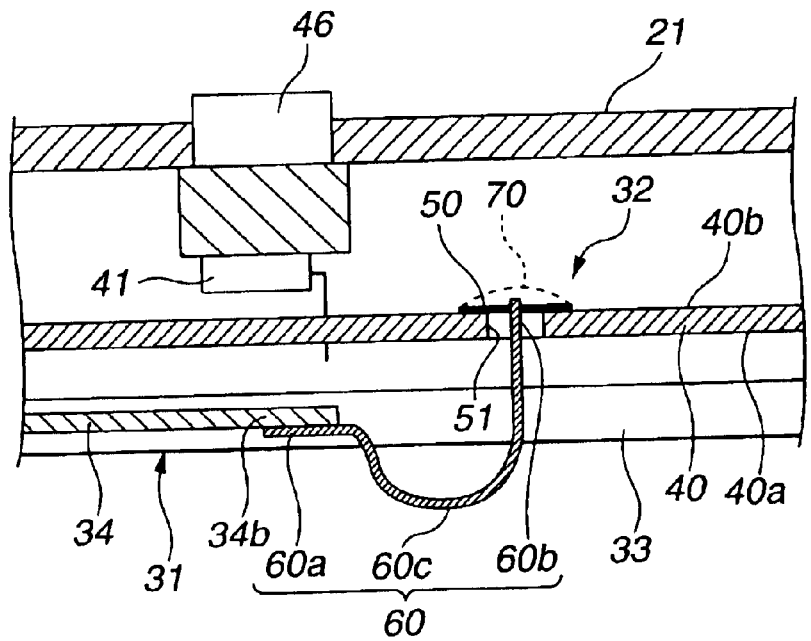
FIG. 8A is a partial cross sectional view showing that an end portion of another fuse member is soldered on a terminal portion of a wiring pattern.
Figure 8B:
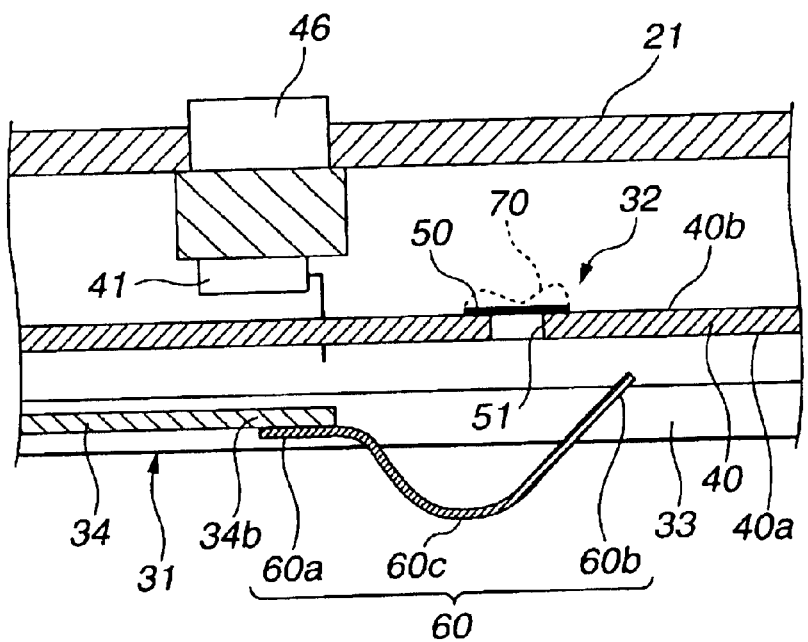
FIG. 8B is a partial cross sectional view showing that the end portion of the fuse member is released from the terminal portion of the wiring pattern due to melting of solder.

FIGS. 8A and 8B show a modification of the fuse member 60 employed in the brushless motor 1 according to the present invention.

The embodiment according to the present invention has been shown and described such that the other end portion 60*b* of the fuse member 60 is soldered on the terminal portion of the wiring pattern 50 formed on the back surface 40*a* which is opposite to the inner case 33 and which is a back of the front surface 40*b* of the printed wiring board 40.

In contrast to this, the modification shown in FIGS. 8A and 8B is arranged such that a through hole 51 is formed so as to penetrate the printed wiring board 40 in a thickness direction, and that the other end portion 60*b* of the fuse member 60 penetrates the through hole 51, and that the other end portion 60*b* is soldered with the terminal portion of the wiring pattern 50 formed on the front surface 40*b* of the printed wiring board 40 which surface 40*b* is a back of the back surface 40*a* opposite to the inner case 33.

Herein, when the terminal portion of the wiring pattern 50, which is soldered with the other end portion 60*b* of the fuse member 60 as shown in FIG. 8A, is heated to increase its own temperature and when the solder 70 provided on the terminal portion of the wiring pattern 50 is melted, the other portion 60*b* of the fuse member 60 is detached from the through hole 51 and is released from the terminal portion of the wiring pattern 60, due to the elastic returning force of the fuse member 60 as shown in FIG. 8B. Therefore, the solder 70 attached on the other end portion 60*b* of the fuse member 60 is certainly separated from the other end portion 60*b* during the process that the other end portion 60*b* of the fuse member 60 is detached from the through hole 51 of the printed wiring board 40.

Accordingly, in this modification, the melted solder 70 remains at the terminal portion of the wiring pattern 50 without dropping from the terminal portion. Therefore, the electrical connection between the filter circuit of the first circuit section 31 and the control circuit of the second circuit section 32 is certainly cut.

Further, the fuse member 60 of the brushless motor 1 according to the present invention is not limited to the above-discussed arrangements, and the shape of the fuse member 60 may be formed into other shapes which are arranged to perform a sufficient elastic deformation quantity and a proper elastic returning force and to be disposed at a proper position so as not to interfere with the arrangements of electric parts near the fuse member 60.

Figure 9A:
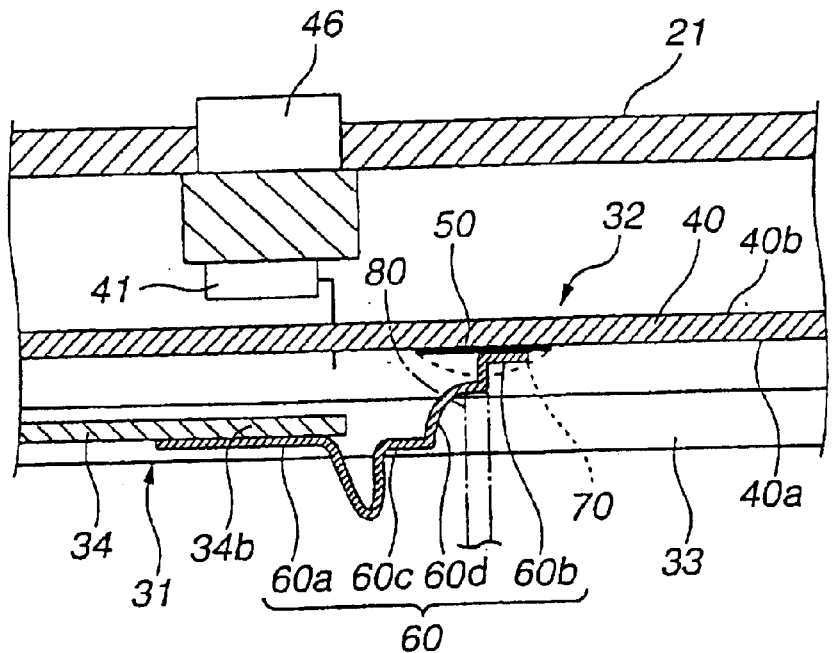
FIG. 9A is a partial cross sectional view showing that an end portion of another fuse member is soldered on a terminal portion of a wiring pattern.
Figure 9B:
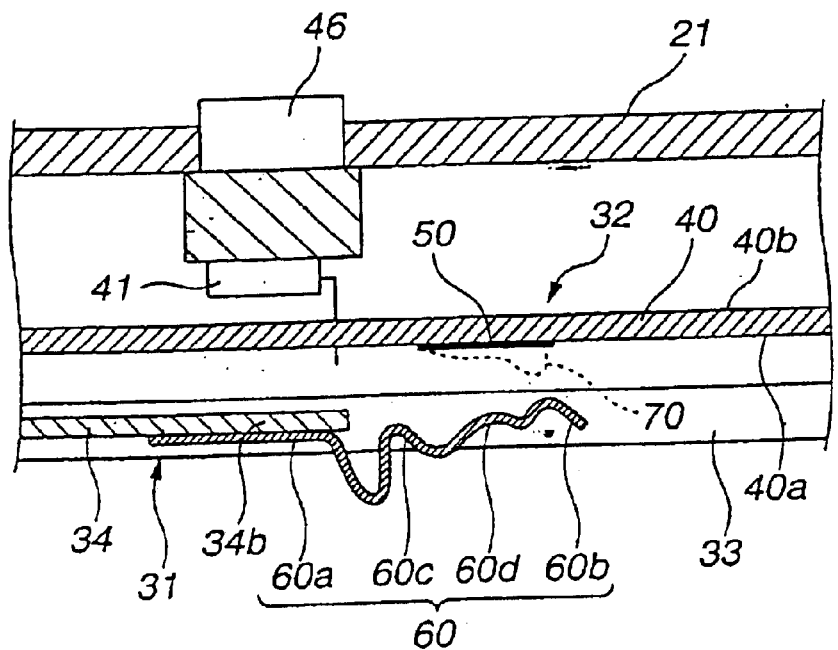
FIG. 9B is a partial cross sectional view showing that the end portion of the fuse member is released from the terminal portion of the wiring pattern due to melting of solder.

FIGS. 9A and 9B show another modification of the fuse member 60 employed in the brushless motor 1 according to the present invention.

In this another modification, the fuse member 60 is arranged so as to have a jig receiving portion 60*d* at an intermediate portion 60*c* near the other end portion 60*b* of the fuse member 60, as shown in FIGS. 9A and 9B. The jig receiving portion 60*d* is formed so as to be able to sink toward the printed wiring board 40. The other end portion 60*b* of the fuse member 60 is connected with the terminal portion of the wiring pattern 50 by contacting a top end of a jig 80 with the jig receiving portion 60*d* of the fuse member 60, by pushing the jig receiving portion 60*d* by means of the jig 80 so as to elastically deform the fuse member 60 and to contact the other end portion 60*b* with the terminal portion of the wiring pattern 50, and by soldering the other end portion 60*b* and the terminal portion of the wiring pattern 50. With this arrangement of the fuse member 60 in another modification shown in FIGS. 9A and 9B, even if the fuse member 60 is excessively pushed by the jig 80, the fuse member 60 maintains the elastic returning force and properly performs as a fuse.

Figure 10:
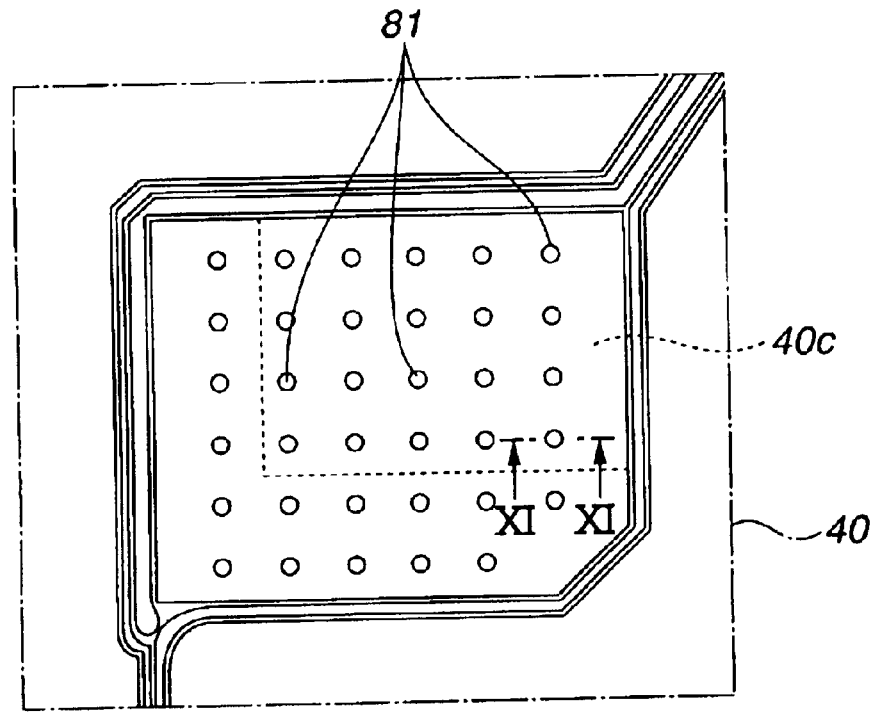
FIG. 10 is a plan view showing a plurality of via holes formed at a portion to be soldered with the fuse member of the printed wiring board.
Figure 11:
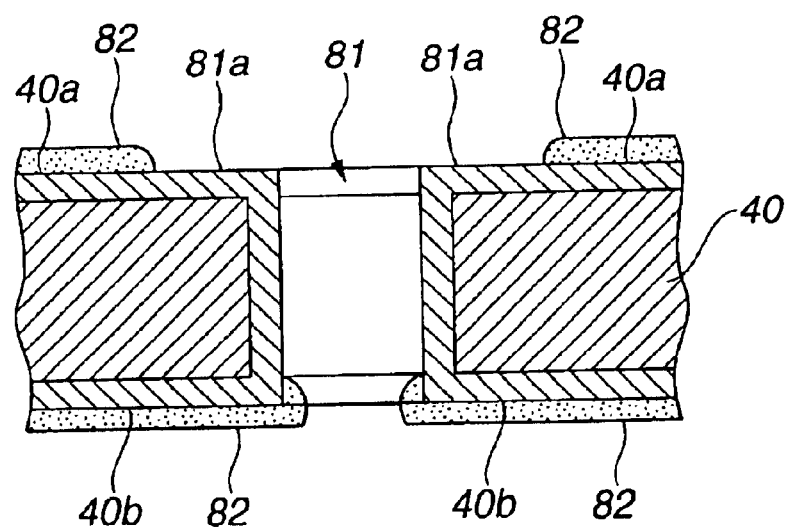
FIG. 11 is a cross sectional view taken in the direction of arrows substantially along the line XI—XI of FIG. 10.

Further, in the embodiment of the brushless motor 1 according to the present invention, the printed wiring board 40 of the second circuit section 32 is arranged such that a plurality of via holes 81 are provided at a portion 40c to which the other end portion 60b of the fuse member 60 is soldered, as shown in FIGS. 10 and 11. The via holes 81 are small through-holes formed by penetrating the printed wiring board 40 in the thickness direction, and inner walls of the via holes 81 are covered with copper films, respectively. Accordingly, when the other end portion 60b of the fuse member 60 is soldered with the terminal portion of the wiring pattern 50, the via holes 81 are filled with the solder 70.

By this arrangement of the via holes 81 in which the solder 70 fills during the soldering between the other portion 60b of the fuse member 60 and the terminal portion of the wiring pattern 50, it becomes possible to radiate the heat of the fuse member 60 from the via holes 81 filled with the solder 70. Therefore, the degradation of the fuse member 60 due to the heat is further effectively suppressed. Further, it is possible to control the degree of the heat radiation by varying the number of the via holes 81. Therefore, the changing of the operation temperature of the fuse member 60 is achieved by changing the number of the via holes 81 without changing the kind of material of the solder 70.

That is, conventionally, when it is necessary to change the operation temperature of the fuse member 60 for disconnecting the electrical connection between the filter circuit of the first circuit section 31 and the control circuit of the second circuit section 32, the material of the fuse member 60 or the kind of the solder 70 have been changed. However, in view of the productivity and the efficiency of parts control, it is not preferable that the fuse member 60 and the kind of the solder 70 are changed by each kind of the brushless motor.

In contrast to this, if such a change of the operation temperature of the fuse member 60 is achieved by providing the plurality of the via holes 81 at a portion 40c to which the other end portion 60b of the fuse member 60 is soldered and by varying the number of the via holes 81, as discussed in the embodiment of the brushless motor 1 according to the present invention without changing the fuse member 60 and/or the kind of the solder 70, the productivity and the efficiency of the parts control for producing the brushless motors are largely improved.

Further, by arranging such that the via holes 81 are filled with the solder 70 when the other end portion 60b of the fuse member 60 is soldered with the terminal portion of the wiring pattern 50, it becomes possible to effectively suppress the peeling between the terminal portion of the wiring pattern 50 and the solder 70.

Furthermore, the printed wiring board 40 having the plurality of the via holes 81 is arranged such that solder land portions 81a are formed on the back surface 40a of the printed wiring board 40 by exposing a copper film at a portion around each of the via holes 81 on the back surface 40a of the printed wiring board 40. The solder land portions 81a on the back surface 40a opposite to the inner case 33 are soldered with the other end portion 60b of the fuse member 60. Further, no solder land portion is formed on the front surface 40b is arranged so that no solder land portion is formed by covering the copper film of the front surface 40a by means of solder resist.

When the other end portion 60b of the fuse member 60 is soldered on the terminal portion of the wiring pattern 50, normally, the melting solder 70 is attached on the terminal portion of the wiring pattern 50 from the back surface 40a of the printed wiring board 40, and is cooled and solidified. If during this fixing process the solder land portions for the via holes 81 are formed on the front surface 40b, the solder 70 entering the via holes 81 tends to flow out from the front surface 40b. This will generate solder bridges on the back surface 40a and may generate a short circuit trouble as to the control circuit.

However, by arranging the front surface 40b which is a back of the back surface 40a of the printed wiring board 40 so as not to have the solder land portion, the via holes 81 function to prevent the excess flow of the solder 70 from excessively flowing out from the front surface 40b and to firmly connect the terminal portion of the wiring pattern 50 and the solder 70.

The entire contents of Japanese Patent Applications No. 2001-242627 filed on Aug. 9, 2001 in Japan and No. 2001-8195 filed on Jan. 16, 2001 in Japan are incorporated herein by reference.

Although the invention has been described above by reference to a certain embodiment of the invention, the invention is not limited to the embodiment described above. Modifications and variations of the embodiment described above will occur to those skilled in the art, in light of the above teaching. The scope of the invention is defined with reference to the following claims.

What is claimed is:

1. A brushless motor comprising:
   a stator comprising a plurality of exciting coils which receives drive current;
   a rotor rotatable relative to the stator;
   a first circuit section comprising a filter circuit for eliminating surges of electric power for the drive current, the first circuit section being produced on a wiring metal piece;
   a second circuit section comprising a control circuit for controlling the magnetic field generated by the stator by controlling the drive current, the second circuit section being produced on a printed wiring board; and
   a fuse member electrically connecting the wiring metal piece of the first circuit section and a wiring pattern formed on the printed wiring board of the second circuit section, the fuse member electrically disconnecting the wiring metal piece and the wiring pattern when a temperature of the wiring pattern becomes higher than a predetermined temperature,
   wherein the fuse member is made of elastic and electroconductive material, wherein a first end portion of the fuse member is fixed on the wiring metal piece of the first circuit portion, wherein an other end portion of the fuse member is soldered with the wiring pattern by means of solder which melts at the predetermined temperature, wherein the other end portion of the fuse member is inserted into a through hole formed on the printed wiring board, and wherein the other end portion of the fuse member is soldered with the wiring pattern formed on a back of a surface of the printed wiring board which is opposite to the wiring metal piece.

2. The brushless motor as claimed in claim 1, wherein the fuse member has a jig receiving portion which is pushed by a jig when the other end portion of the fuse member is contacted and soldered with the wiring pattern.

3. A brushless motor comprising:
   a stator comprising a plurality of exciting coils which receives drive current;
   a rotor rotatable relative to the stator;
   a drive control circuit supplying the drive current to the exciting coils, the drive control circuit comprising a first circuit section for eliminating surges of electric power and a second circuit section for controlling magnetic field generated by the stator by controlling drive current treated in the first circuit section, the first circuit section and second circuit section being arranged generally in parallel with a predetermined space therebetween; and a fuse member electrically connecting the first circuit section and the second circuit section, an end portion of the fuse member being welded with the first circuit section, the other end portion of the fuse member being soldered with second circuit section, the fuse member cutting an electrical connection between the first circuit section and the second circuit section when a temperature of a part of the second circuit section becomes higher than a predetermined temperature.

4. The brushless motor as claimed in claim 3, wherein the fuse member is located on a back of a surface of the printed wiring board on which switching devices are installed.

5. The brushless motor as claimed in claim 3, wherein a plurality of via holes are formed at a portion of the printed wiring board on which the other end portion of the fuse member is soldered.

6. The brushless motor as claimed in claim 5, wherein solder land portions are formed on a back surface of the printed wiring board by exposing a copper film at a portion around each of the via holes on the back surface of the printed wiring board.

7. The brushless motor as claimed in claim 6, wherein the solder land portions on the back surface are soldered with the other end portion of the fuse member.

8. The brushless motor as claimed in claim 6, wherein no solder land portion is formed on a front surface which is a back of the back surface on which the other end portion of the fuse member is soldered.

9. The brushless motor as claimed in claim 3, wherein the first circuit section and the second circuit section are arranged in parallel with a predetermined distance therebetween.

10. The brushless motor as claimed in claim 9, wherein an end portion of the fuse member is fixed on the wiring metal piece of the first circuit portion by welding, and the other end portion of the fuse member is soldered with the wiring pattern by means of solder which melts at the predetermined temperature.

11. The brushless motor as claimed in claim 9, wherein the fuse member is made of elastic and electro-conductive material, and the other end portion of the fuse member is soldered with the wiring pattern while the fuse member is elastically deformed so that the other end portion of the fuse member is detached from the wiring pattern when the solder melts.

12. The brushless motor as claimed in claim 3, the first circuit section and the second circuit section are arranged three-dimensionally.

13. A circuit structure of a brushless motor, comprising:

a drive control circuit supplying drive current to exciting coils of a stator of the brusless motor, the drive control circuit comprising a first circuit section for eliminating surges of electric power and a second circuit section for controlling magnetic field generated by the stator by controlling drive current passed through the first circuit section in order to control a rotation of a rotor of the brushless motor, the first and second circuit sections being three-dimensionally arranged with a predetermined space therebetween; and a fuse member comprising a first end portion welded with the first circuit section, a second end portion soldered with the second circuit section and an intermediate elastic portion which is elastically deformed when the second end portion is soldered with the second circuit section, the second end portion being released from the second circuit section when solder connecting the second end portion and the second circuit section is melted.

* * * * *